United States Patent [19]

Handley

[11] Patent Number: 5,831,557
[45] Date of Patent: Nov. 3, 1998

[54] VARIABLE LENGTH CODE DECODING ACCORDING TO OPTIMUM CACHE STORAGE REQUIREMENTS

[75] Inventor: Maynard J. Handley, Cupertino, Calif.

[73] Assignee: Apple Computer, Inc., Cupertino, Calif.

[21] Appl. No.: 660,590

[22] Filed: Jun. 11, 1996

[51] Int. Cl.[6] .................................................. H03M 7/40
[52] U.S. Cl. .................................................. 341/67
[58] Field of Search ........................... 341/67; 11/55, 11/106; 395/380

[56] References Cited

U.S. PATENT DOCUMENTS 5,625,355  4/1997  Takeno et al. ........................ 341/67
5,625,787  4/1997  Mahin et al. ......................... 395/380

Primary Examiner—Brian K. Young
Attorney, Agent, or Firm—Edward W. Scott, IV

[57] ABSTRACT

A method and apparatus in a computer system for decoding variable length codes (VLC's). Upon receiving a sample VLC from the bitstream, it is determined whether it has a predetermined relationship with a first pattern. The first pattern includes a first portion having a predetermined pattern. A length of the first portion of the sample VLC corresponds to an optimum number of cache lines. If the sample VLC has the predetermined relationship with the first pattern, then the sample VLC is used to retrieve a first decoded value from a first table. Otherwise, if the sample VLC does not have the predetermined relationship with the first pattern, then the sample VLC is used to retrieve a second decoded value from a second table.

24 Claims, 5 Drawing Sheets

VARIABLE LENGTH CODE DECODING ACCORDING TO OPTIMUM CACHE STORAGE REQUIREMENTS

BACKGROUND OF THE INVENTION

1. Field of the Invention

The present invention relates to decoding in a computer system. More specifically, the present invention relates to decoding variable length codewords, such as those used in encoded video and/or audio bitstreams.

2. Background

Decoding variable length data is often used for compression of data, such as video or audio bitstreams. For example, variable length codes are used to represent many aspects of video encoding, including macroblock addressing, macroblock type, and macroblock motion codes, such as those used in the MPEG (Motion Picture Experts Group) Standard. Other applications of variable length coding are known in the art.

Variable-length decoding presents certain challenges. Frequently, such decoding must take place in a real-time environments, wherein decoded values representing audio or video information must be decoded and available for presentation within a finite (often short) period of time. It is therefore desirable that decoding methods and mechanisms be optimized to have as little latency as possible in order that the decoded bitstream be available for presentation at the appropriate time. Certain prior art mechanisms for decoding variable length data, expressed as variable length codewords (VLC's), often lack the capability to decode many VLC's in real-time.

For example, one prior art implementation for decoding a VLC is shown in FIG. 1. An encoded bitstream 100 is sampled at a given point in time to obtain an input VLC 102. VLC 102 has a maximum bitlength of N bits, so the sampled input VLC 102 comprises N bits. All of the N bits of VLC 102 are provided at once over a communication channel 104 to a lookup table 106. The single lookup table 106 is frequently stored in a computer system main memory for the decoding. As is apparent, lookup table 106 comprises $2^N$ entries. Thus, for a VLC having a maximum possible length N=11 bits, the single lookup table 106 would comprise $2^{11}$ or 2048 entries. The results of the table lookup is a datum 108 which includes two portions. A first portion of the datum is the resulting decoded value 108a. A second portion 108b of the datum is a length of the VLC or offset value which is used to move a pointer referencing a current location in the bitstream 100. This is used to locate the beginning of the next VLC for a subsequent iteration of the decoding process.

Because the size of a single lookup table 106 is based upon the maximum possible length N of the VLC, it consumes much more space than is usually required during decoding. Because VLC's are most often much shorter than the maximum length, the remainder of the sample VLC is frequently not used during this iteration of the decode process.

Another shortcoming of using a single table based on the maximum possible VLC length N, is very poor cache locality. The VLC's are frequently shorter than the maximum VLC length N, and arrive serially often as part of a bitstream transmitted between endpoints. The VLC present in the input sample having the maximum length often comprises the high bits only. As a result, the accesses in the single table using a sample having the maximum possible VLC length can be widely dispersed throughout memory. The lookup table addressed by a datum having a maximum VLC length N for decoding all the possible VLC's can span across many cache lines, frequently more cache lines than the capacity of the system. This can cause cache missing which hampers decode performance.

Due to this cache missing, performance of each iteration of the decoding is sub optimal. It is therefore desirable to minimize such cache misses during decode in order to increase decode performance in a VLC decoder.

SUMMARY

A method and apparatus in a computer system for decoding variable length codes (VLC's), for example, those in an audio and/or video input bitstream. Upon receiving a sample VLC from the bitstream, it is determined whether it has a predetermined relationship with a first pattern. The first pattern includes a first portion having a predetermined pattern. A length of the first portion of the sample VLC corresponds to an optimum number of cache lines. If the sample VLC has the predetermined relationship with the first pattern, then the sample VLC is used to retrieve a first decoded value from a first table. Otherwise, if the sample VLC does not have the predetermined relationship with the first pattern, then the sample VLC is used to retrieve a second decoded value from a second table.

The first pattern includes a first valid VLC which is within a cache line boundary. Thus, if the sample VLC has the predetermined relationship with the first pattern (e.g. greater than a threshold value represented by the first pattern), then a lookup is made into the first table. The length of the first table is thereby constrained to a length within the optimum number of the cache lines. Once the cache lines are loaded, short, often frequent, VLC's which are decoded in the first table access the cache instead of main memory, and thereby enhance decode performance.

Using the sample VLC to retrieve the first decoded value from the first table includes using a first portion of the sample VLC to access a first location in the first table, and retrieving the first decoded value therefrom. Using the sample VLC to retrieve the second decoded value from the second table includes using a second portion of the sample VLC to access a first location in the second table, and retrieving the second decoded value therefrom. Thus, the sample VLC is effectively partitioned into the portion used for accessing the first table, and that for accessing the second table.

BRIEF DESCRIPTION OF THE DRAWINGS

The present invention is illustrated by way of example and not limitation in the figures of the accompanying in which like references indicate similar elements and in which.

DETAILED DESCRIPTION

The present invention relates to the automatic decoding of variable length codes (VLC's). This decoding may take place in a variety of environments, including, programmed computer systems or devices, or dedicated devices for such decoding. Although the present invention will be described with reference to certain specific embodiments thereof, especially, with relation to certain hardware configurations, bit lengths, encoding methods and formats, method steps, and other specific details, these should not be viewed as limiting the present invention. Various modifications and other changes may be made by one skilled in the art, without departing from the overall spirit and scope of the present invention.

A portion of the disclosure of this patent document contains material which is subject to copyright protection. They copyright owner has no objection to the facsimile reproduction by anyone of the patent disclosure, as it appears in the Patent and Trademark Office patent files or records, but otherwise reserves all copyright rights whatsoever. Copyright© Apple Computer, Inc.

Figure 2:
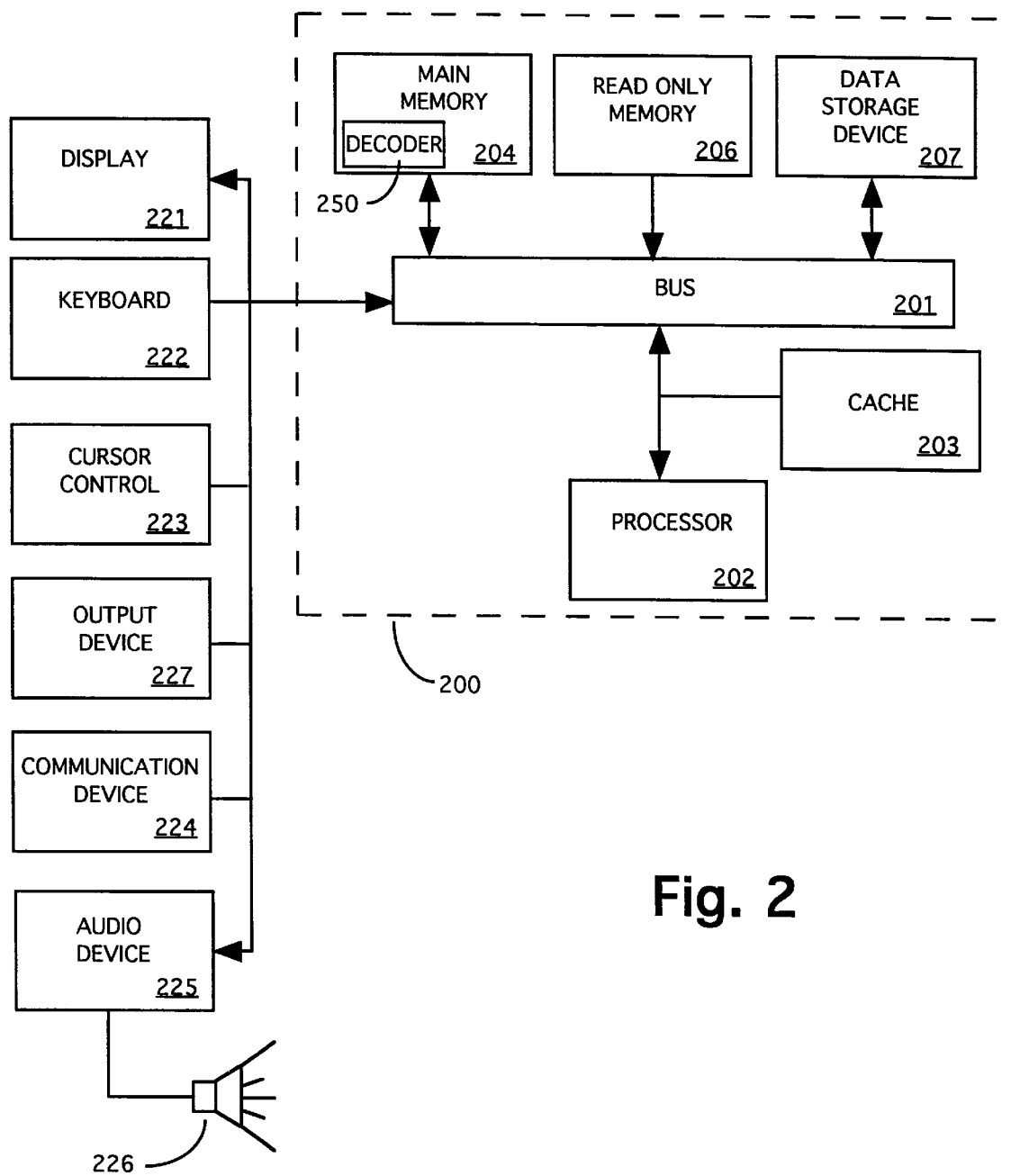
FIG. 2 shows a system upon which VLC decoding may be implemented.

A typical system configuration in which embodiments of the present invention may be implemented is shown in FIG. 2. In various embodiments of the present invention, a general purpose computer system is used for implementing the methods and mechanisms to be described here. A computer system, such as a workstation, personal computer or other processing apparatus 200 is illustrated in more detail in FIG. 2. 200 comprises a bus or other communication means 201 for communicating information, and a processor 202 coupled with bus 201 for processing information. System 200 further comprises a random access memory (RAM or other volatile storage device 204 (referred to as main memory), coupled to bus 201 for storing information and instructions to be executed by processor 202. Main memory 204 also may be used for storing temporary variables or other intermediate information during execution of instructions by processor 202 during run-time. System 200 also comprises a read only memory (ROM) and/or other static storage device 206 coupled to bus 201 for storing static information and instructions for processor 202, and a data storage device 207 such as a magnetic disk or optical disk and its corresponding disk drive. Data storage device 207 is coupled to bus 201 for storing information and instructions.

System 200 may further be coupled to a display device 221 such as a cathode ray tube (CRT) or liquid crystal display (LCD) and adapter coupled to bus 201 for displaying information to a computer user. Such a display 221 may further be coupled to bus 201 for the receipt of video or image information. An alphanumeric input device 222, including alphanumeric and other keys may also be coupled to bus 201 for communicating information and command selections to processor 202. An additional user input device may be cursor control device 223, such as a mouse, a trackball, stylus, or cursor direction keys, coupled to bus 201 for communicating direction information and command selections to processor 202, and for controlling cursor movement on display 221. A hard copy output device 227 can also be coupled to bus 201 for generating hard copy information.

System 200 may also include a communication device 224 which is useful for communicating with networks and/or other systems. For example, this may include a network adapter which is configured to receive (and transmit, if desired) signals over a computer network. System 200 may also include an audio device 225 including an amplifier for the output of audio information to a transducer such as a speaker 226.

Main memory 204 of system 200 may include therein an executable program or module 250 for decoding information within system 200. This may include an audio and/or video decoder (e.g. an MPEG decoder). This module includes executable instructions which are retrieved from main memory 204 and executed by processor 202. Instructions and other information may be cached in a cache 203 coupled to processor 202, including instructions of and/or data used by decode module 250. Cache 203 may be internal to processor 202 (e.g. an L1 cache) and/or external to processor 202 (an L2 cache) according to different implementations.

Note, also, that any or all of the components of system 200 and associated hardware may be used in various embodiments, however, it can be appreciated that any configuration of the system may be used for various purposes according to the particular implementation.

In one embodiment, system 200 is one of the Apple® brand computer family of personal computers such as the Power Macintosh® 8100 brand personal computer manufactured by Apple Computer, Inc. of Cupertino, Calif. (trademarks of Apple Computer, Inc.). Processor 202 may be one of the PowerPC™ (trademark of International Business Machines Corporation) brand microprocessors.

Note that the following discussion of various embodiments discussed herein will refer specifically to a series of routines which are generated in a high-level programming language (e.g., the C++ programming language) and compiled, linked, and then run as object code in system 200 during run-time within main memory 204 by processor 202.

Although a general purpose computer system has been described, it can be appreciated by one skilled in the art, however, that the following methods and apparatus may be implemented in special purpose hardware devices, such as discrete logic devices, large scale integrated circuits (LSI's), application-specific integrated circuits (ASIC's), or other specialized hardware. The description here has equal application to apparatus having similar function.

Figure 1:
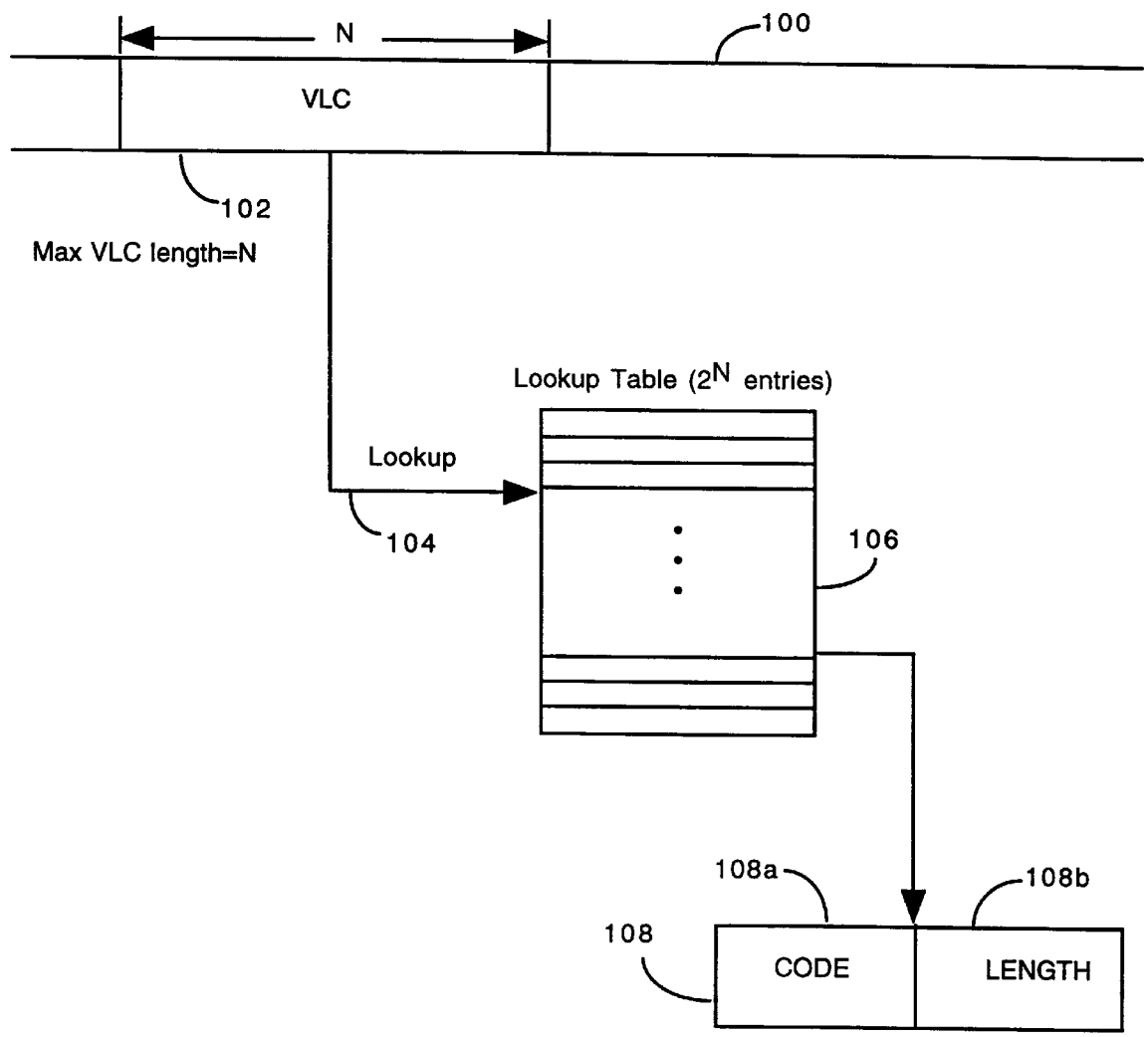
FIG. 1 illustrates a prior art mechanism for VLC decoding.
Figure 3:
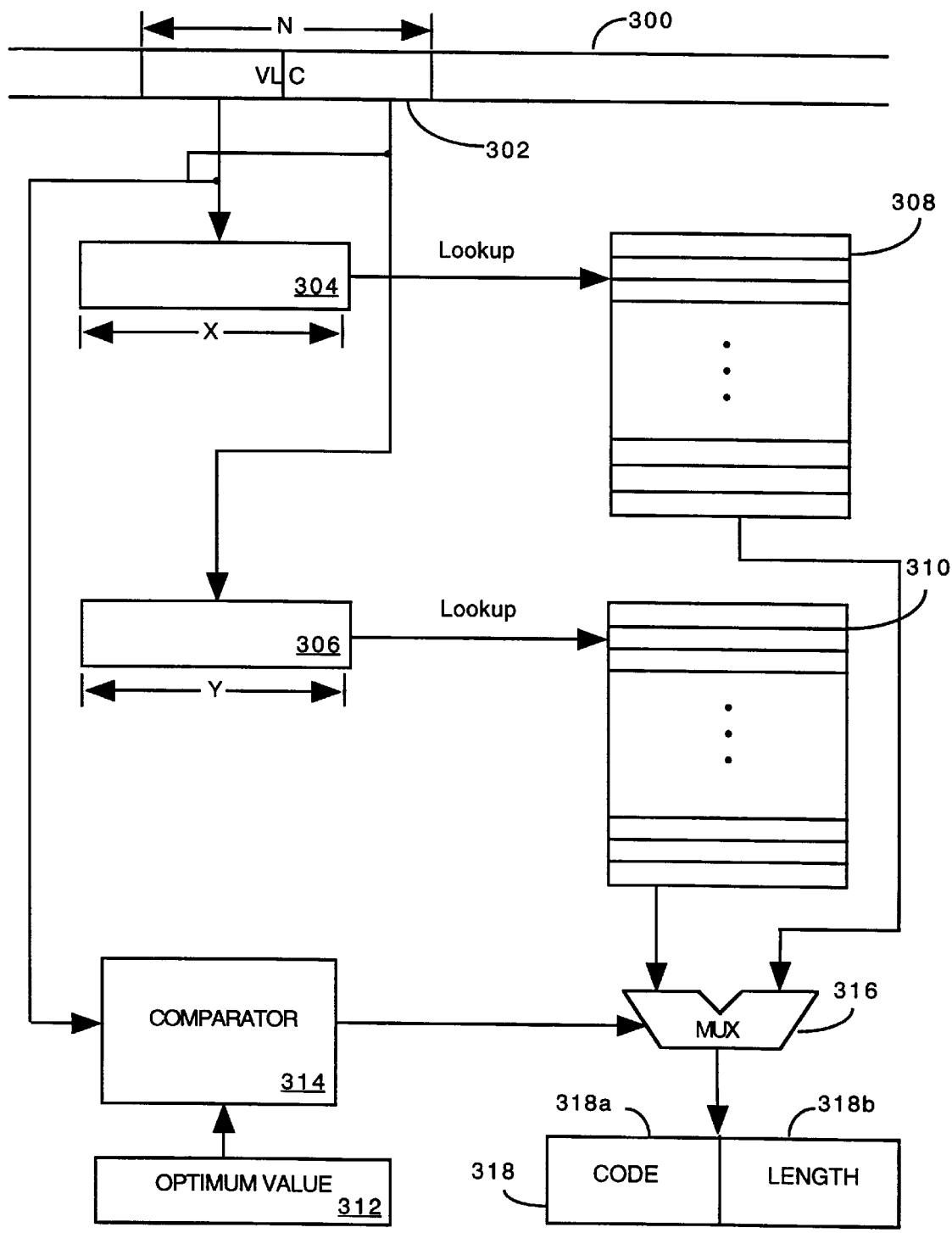
FIG. 3 shows a mechanism for VLC decoding.

FIG. 3 shows the functionality of a decoder implemented in embodiments of the present invention. An input VLC 302 is sampled from the input bitstream. The input VLC 302 comprises N bits, the maximum length of any expected VLC. In contrast to the prior art implementation of FIG. 1, this implementation divides the sampled input VLC 302 into two portions 304 and 306. 304 comprises the high order X bits of the input VLC, and 306 includes the low order Y bits of the input VLC. Of course, the sample VLC 302 may be further divided into more than two portions, according to implementation. The portions 304 and 306 of input VLC 302 are supplied to separate lookup tables 308 and 310. Because of the partition of the input VLC 302 into separate portions having X and Y bits, each lookup table has $2^X$ and $2^Y$ entries, respectively. The single large table which is widely distributed throughout memory, as in the prior art, been divided into more than one table, but each of the tables are constrained to a more narrow memory range, desirably, one which each can be cached for improved decode performance. In fact, it is an objective that at least the first table, indexed by the high-order bits 304 of the sample VLC 302 only, be cached, so that the most frequently accessed, often short, VLC codes cause cache hits, improving decoder performance.

The results of the lookups into tables 308 and 310 are provided to a multiplexer 316. Either the results of the lookup from table 308 or table 310 are provided as the results of the decode. A comparator 314 controls the multiplexer 316. The comparator 314 arithmetically compares the entire sample VLC 302 with an optimum value 312. According to the results of this comparison, either the value retrieved from table 308 or table 310 is provided as the resulting lookup value 318. The lookup value 318 includes at least two portions: a code 318a, the decode value; and a length 318b of the current VLC.

By carefully choosing the optimum value 312, a partition between a first and second ranges of VLC can be established. Implemented embodiments of the present invention use a value against which the whole input VLC sample 302 can be arithmetically compared and determine whether lookup table 308 or lookup table 310 will be used as for the resulting lookup value. The comparator 314 determines if the sample 302 has a predetermined relationship to some preestablished bit pattern or optimum value 312. The optimum value 312 represents a selected partition in the range of expected VLC's for performing lookups in the two table 308 and 310. For example, depending on the type of encoding, if the expected VLC diverges rapidly after a VLC code having 5 bits, then the partition could be at 5 bits (X=5). In this instance, the optimum value 312 would have the high-order 5 bits set to some predetermined pattern (usually the first valid VLC code 5 bits long or less), and the sample VLC 302 is arithmetically compared with this optimum value 312. If the sample VLC 302 has a predetermined relationship (e.g. greater than or equal to) the optimum value 312, then lookup table 308 is used for the results of the lookup. Otherwise lookup table 310 is used.

The number of bits X and Y is a matter of design choice. It is important, however, that the size of the lookup table 308 indexed by the first portion of the sample VLC 302 be limited to some optimum number of cache lines which the designer is willing to dedicate to this particular type of decoding. In most instances, the fewer cache lines the better—usually one or two. In one implementation, the VLC included in the input sample VLC 302 is frequently, and is naturally-divisible between the high-order 5 bits (X=5) and the rest of the input VLC. This provides very good cache locality. Because most uses of VLC's are encoded with the most frequent VLC having the shortest bit patterns, and diverge quickly to longer patterns, by partitioning the sample VLC for lookups into multiple tables good cache locality is provided in a first table, and subsequent accesses will cause more frequent cache hits due to accesses to that table. The more often cache hits occur, the better the performance of the decoder.

Choice of the optimum or "split" value 312 for dividing the possible VLC's into partitions for the lookup tables is important. The value is dependent upon design choice according to the number of lines that want to be dedicated towards the particular type of VLC decoding, and the characteristics of the VLC itself. For example, as shown in Table 1 the variable length codes for motion values in this motion prediction technique rapidly diverge to more lengthy codes after VLC's which are 5 bits long. In some architectures, 5 bits is used for two cache lines, which can be dedicated to this motion prediction decoding.

TABLE 1

Variable length codes for motion prediction

| motion VLC code | code |
|---|---|
| 0000 0011 001 | −16 |
| 0000 0011 011 | −15 |
| 0000 0011 101 | −14 |
| 0000 0011 111 | −13 |
| 0000 0100 001 | −12 |

TABLE 1-continued

Variable length codes for motion prediction

| motion VLC code | code |
|---|---|
| 0000 0100 011 | −11 |
| 0000 0100 11 | −10 |
| 0000 0101 01 | −9 |
| 0000 0101 11 | −8 |
| 0000 0111 | −7 |
| 0000 1001 | −6 |
| 0000 1011 | −5 |
| 0000 111 | −4 |
| 0001 1 | −3 |
| 0011 | −2 |
| 011 | −1 |
| 1 | 0 |
| 010 | 1 |
| 0010 | 2 |
| 0001 0 | 3 |
| 0000 110 | 4 |
| 0000 1010 | 5 |
| 0000 1000 | 6 |
| 0000 0110 | 7 |
| 0000 0101 10 | 8 |
| 0000 0101 00 | 9 |
| 0000 0100 10 | 10 |
| 0000 0100 010 | 11 |
| 0000 0100 000 | 12 |
| 0000 0011 110 | 13 |
| 0000 0011 100 | 14 |
| 0000 0011 010 | 15 |
| 0000 0011 000 | 16 |

In this example, the bit pattern (0001 0000 0000) may be used as the optimum value. This is the first valid VLC which is five bits in length. Any VLC's having a predetermined relationship with the optimum value causes a lookup into the first table in this embodiment of the present invention. Other values of the VLC are accessed in a second table. Additional levels of tables may be added according to design choice.

Besides a partition which occurs in VLC codes themselves, and the cache storage requirements and capacity of the decoder, in another embodiment, the determination of the optimum value can be ascertained by performing a timing analysis of sample VLC bitstreams. In one such embodiment, for each type of VLC code, timing of decoding of sample streams may be performed, stepping through the valid codes for particular VLC's at cache line boundaries for separate tables until a decode performance increase is observed. Once a performance increase is observed, then the tested-for value can be used as the optimum value. Note that in any embodiment, if the optimum value does not fall on a cache line boundary, then a value may be chosen that is shorter than that required to reference such a boundary.

A second example of a particular type of VLC which may be encoded using the mechanisms and methods described here includes the macro-block addressing codes shown in Table 2.

TABLE 2

Variable length codes for macroblock addressing

| macroblock_address_ increment VLC code | increment value | macroblock_address_ increment VLC code | increment value |
|---|---|---|---|
| 1 | 1 | 0000 0101 10 | 17 |
| 011 | 2 | 0000 0101 01 | 18 |
| 010 | 3 | 0000 0101 00 | 19 |

TABLE 2-continued

Variable length codes for macroblock addressing

| macroblock_address_ increment VLC code | increment value | macroblock_address_ increment VLC code | increment value |
|---|---|---|---|
| 0011 | 4 | 0000 0100 11 | 20 |
| 0010 | 5 | 0000 0100 10 | 21 |
| 0001 1 | 6 | 0000 0100 011 | 22 |
| 0001 0 | 7 | 0000 0100 010 | 23 |
| 0000 111 | 8 | 0000 0100 001 | 24 |
| 0000 110 | 9 | 0000 0100 000 | 25 |
| 0000 1011 | 10 | 0000 0011 111 | 26 |
| 0000 1010 | 11 | 0000 0011 110 | 27 |
| 0000 1001 | 12 | 0000 0011 101 | 28 |
| 0000 1000 | 13 | 0000 0011 100 | 29 |
| 0000 0111 | 14 | 0000 0011 011 | 30 |
| 0000 0110 | 15 | 0000 0011 010 | 31 |
| 0000 0101 11 | 16 | 0000 0011 001 | 32 |
|  |  | 0000 0011 000 | 33 |
|  |  | 0000 0001 111 | 34 |
|  |  | 0000 0001 000 | 35 |

Again, because the valid VLC codes diverge rapidly after the first five bits, a possible split value would include one in which the high-order five bits are set to the first valid five bit VLC—0001 0. This five bit pattern is padded to have a length of 12 bits for the comparison with the entire sample VLC, such as 0001 0000 0000. Thus, any sampled VLC's having values arithmetically greater than or equal to this optimum value, would cause a lookup into the first table. Because the first table is indexed by 5 bits, good cache locality is achieved, and minimal cache lines are dedicated for storing the first table for this type of VLC (two in some architectures). Once the cache lines are loaded, performance of subsequent decodes will be improved due to cache hits.

Figure 4:
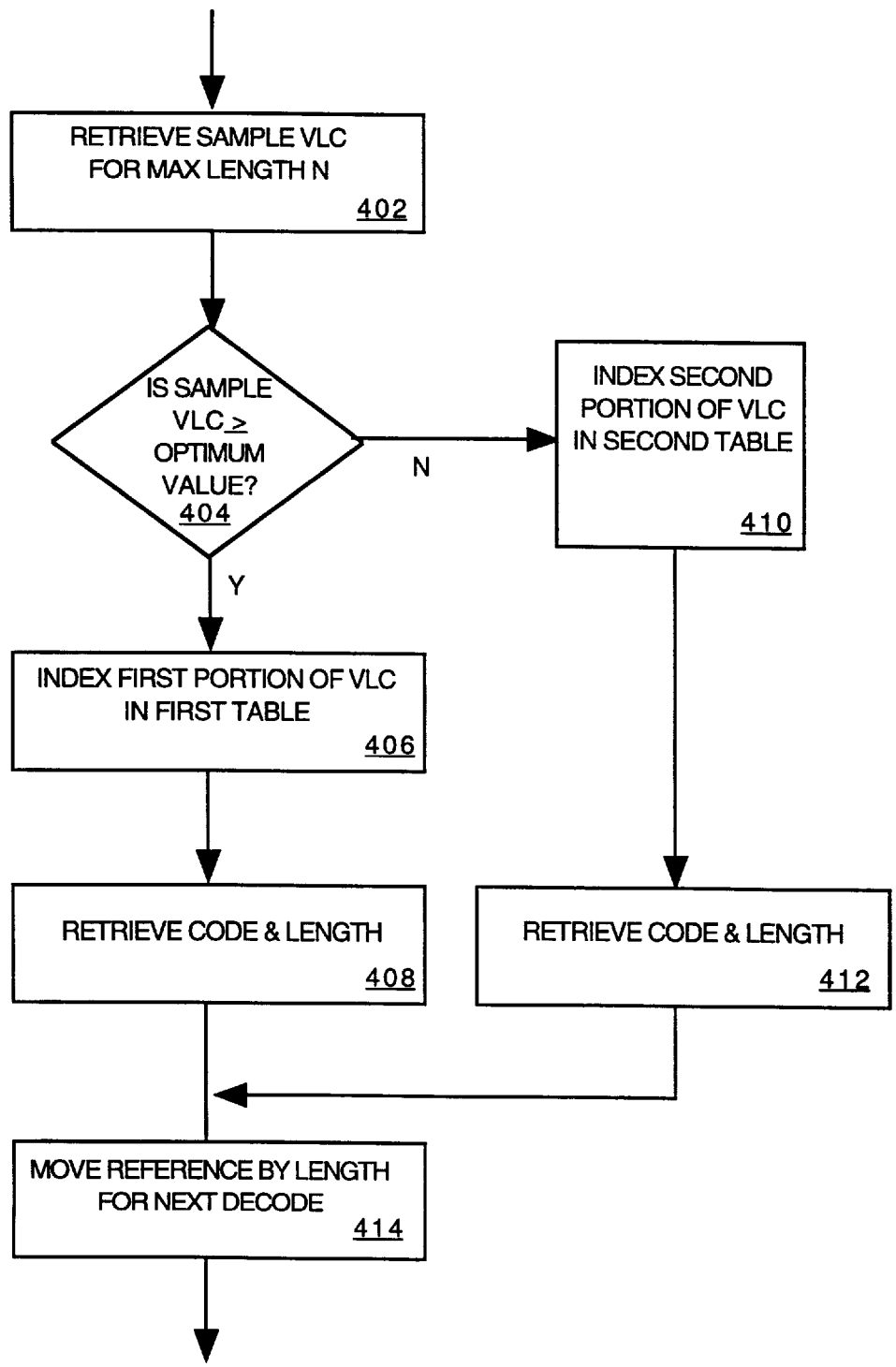
FIG. 4 shows a method for VLC decoding.

A sequence of method steps for decoding a particular type of VLC is summarized with reference to FIG. 4. These steps may be part of a larger process for decoding an audio and/or video bitstream which includes many types of VLC's. At step 402 a sample or input VLC is obtained by sampling the input bitstream. This sample VLC has the maximum VLC length N, which varies according to the type of VLC being decoded. The VLC is then checked arithmetically at step 404 against the optimum value for a predetermined relationship. In this instance, the relationship being checked for is whether the sample VLC is greater than or equal to the optimum value, but it may have some other relationship according to the implementation.

If the sample VLC has the predetermined arithmetic relationship with the optimum value, then the first portion of the VLC is used to index into the first table at step 406. Upon an initial iteration of this process, the cache line(s) will be loaded with the first table, and subsequent decodes of such VLC's with a length of five bits or less will cause cache hits into the first table. Subsequent to indexing into the first table, the decode value for the VLC is retrieved at step 408. The code is then made available to the remainder of the decode process, and the reference in the bitstream is shifted by the length (offset) value for the VLC at step 414 in preparation for the next decode.

In the case that the sample VLC does not have the predetermined relationship with the optimum value, then the second table is indexed at step 410. In this instance, the remainder of the VLC comprising the remaining low-order Y bits is used to access the code and length values from the second table at step 412. Like the first instance, the length value is used to shift a reference to the input bitstream by the number of bits which comprise the decoded VLC at step 414 in preparation for the next iteration of the VLC decoding steps 402–414.

Assuming that the optimum value has been chosen using the above-considerations, after the initial loading of the cache line(s), most accesses will be to the first table. Because these locations have been cached, will substantially increase performance increases will be realized. Embodiments of the present invention, especially when implemented in processors which perform branch operations efficiently will not suffer any degradation in performance due to the branching to the steps which access the first or second tables. Embodiments exploit the efficient execution of branch operations in any architectures while avoiding the significant latency due to memory accesses which in which cache missing occurs.

Figure 5:
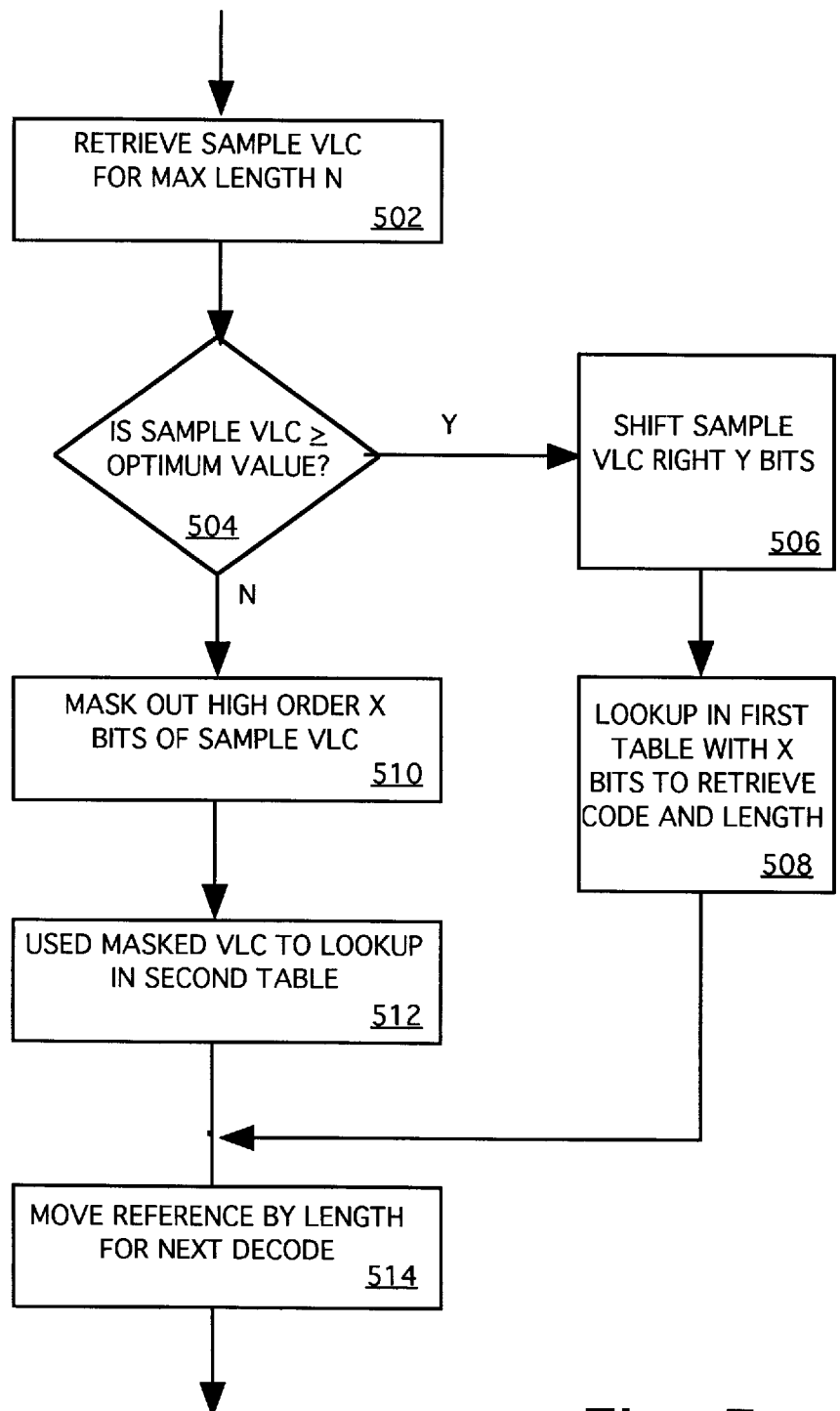
FIG. 5 shows a second method for VLC decoding.

A specific implementation of the method of FIG. 4 is shown in FIG. 5. Again, the sample VLC is retrieved comprising the maximum possible length of N bits at step 502. At step 504 the entire sample VLC is compared against the optimum value. If the sample VLC has the tested-for relationship (e.g. greater than or equal to) with the optimum value, then the first table is accessed at steps 506 and 508. At step 506 the sample VLC is shifted right by Y bits to align the high-order bits comprising the actual code to access the first table. Note that a shift operation which causes the use of only the high order bits of the sample VLC for accessing the first table enables the caching of the first table. The bit patterns which would otherwise be in the high-order bits of an index value to be constrained to a more narrow memory range, desirably, within an optimum number of cache lines desired to be dedicated to this particular type of VLC decoding. Thus, instead of the prior art wherein frequent VLC codes are in the high order portion of the index, causing memory accesses throughout main memory, the partitioning of the sample VLC into portions each used individually to index different tables enhances decode performance by limiting each indexed portion of the sample VLC to reference a more narrow memory range which can be cached.

Then, at step 508 the first table is accessed using the shifted input VLC, and the code and length values are retrieved. At step 514, the reference or pointer to the current location in the bitstream is moved in preparation for the next decode.

In the case of the sample VLC not having the tested-for arithmetic relationship with the optimum value, the second table is accessed at steps 510 and 512. In this instance, at step 510, the X high-order bits of the sample VLC are masked. In the instance of VLC's longer than X bits, the high-order X-bits are not required, because the high-order bits of these VLC's are usually equal in most schemes (see, e.g., Tables 1 and 2, above). Once the high-order X bits of the sample VLC are masked by a suitable function or mechanism (e.g. a logical AND), then the masked sample VLC is used to access the second table at step 512. Then, the code may be used by the remainder of the decoding process, and the reference to the current location in the bitstream is shifted by the length value just retrieved at step 514 in preparation for a subsequent iteration of the decode steps.

Thus, by use of the foregoing, improved cache locality for VLC's to improve VLC decoding performance may be achieved. It will be appreciated that though the foregoing has been described especially with reference to FIGS. 1–5, that many modifications made be made, by one skilled in the art, without departing from the scope of the invention as described here. The invention is thus to be viewed as limited only by the appended claims which follow.

What is claimed is:

1. An automatic method for decoding variable length data comprising the following steps:
   a. determining whether a sample variable length code (VLC) has a predetermined relationship with a first pattern, said first pattern including a first portion having a predetermined pattern, a length of said first portion of said sample VLC corresponding to an optimum number of cache lines;
   b. if said sample VLC has said predetermined relationship with said first pattern, then using said sample VLC to retrieve a first decoded value from a first table; and
   c. else if said sample VLC does not have said predetermined relationship with said first pattern, then using said sample VLC to retrieve a second decoded value from a second table.

2. The method of claim 1 wherein said first pattern includes a first valid VLC which is within a cache line boundary.

3. The method of claim 2 wherein said cache line boundary is located at a boundary of said optimum number of cache lines.

4. The method of claim 1 wherein said step of determining whether said sample VLC has said predetermined relationship with said first pattern includes determining if said sample VLC has a value greater than a threshold value represented by said first pattern.

5. The method of claim 1 wherein said step of using said sample VLC to retrieve said first decoded value from said first table includes using a first portion of said sample VLC to access a first location in said first table, and retrieving said first decoded value therefrom.

6. The method of claim 5 wherein said first decoded value includes a data value and a length value and said method further includes the steps of:
   a. using said data value as a decode value; and
   b. shifting said VLC by said length value for subsequent decoding of said variable length data.

7. The method of claim 1 wherein said step of using said sample VLC to retrieve said second decoded value from said second table includes using a second portion of said sample VLC to access a first location in said second table, and retrieving said second decoded value therefrom.

8. The method of claim 7 wherein said second decoded value includes a data value and a length value and said method further includes the steps of:
   a. using said data value as a decode value; and
   b. shifting said VLC by said length value for subsequent decoding of said variable length data.

9. An apparatus for decoding variable length data comprising:
   a. a determinator for determining whether a sample variable length code (VLC) has a predetermined relationship with a first pattern, said first pattern including a first portion having a predetermined pattern, a length of said first portion of said sample VLC corresponding to an optimum number of cache lines;
   b. first table lookup means coupled to said determinator operative if said sample VLC has said predetermined relationship with said first pattern including a means for using said sample VLC to retrieve a first decoded value from a first table; and
   c. second table lookup means coupled to said determinator operative if said sample VLC does not have said predetermined relationship with said first pattern, including a means for using said sample VLC to retrieve a second decoded value from said second table.

10. The apparatus of claim 9 wherein said first pattern includes a first valid VLC which is within a cache line boundary.

11. The apparatus of claim 9 wherein said cache line boundary is located at a boundary of said optimum number of cache lines.

12. The apparatus of claim 9 wherein said determinator includes a means for determining if said sample VLC has a value greater than a threshold value represented by said first pattern.

13. The apparatus of claim 9 wherein said means for using said sample VLC to retrieve said first decoded value from said first table includes a means for using a first portion of said sample VLC to access a first location in said first table, and a means for retrieving said first decoded value therefrom.

14. The apparatus of claim 13 wherein said first decoded value includes a data value and a length value and said apparatus further includes:
   a. decode value storage means for retaining said decode value; and
   b. a means for shifting said sample VLC by said length value for subsequent decoding of said variable length data.

15. The apparatus of claim 9 wherein said means for using said sample VLC to retrieve said second decoded value from said second table includes a means for using a using a second portion of said sample VLC to access a first location in said second table, and a means for retrieving said second decoded value from said second table therefrom.

16. The apparatus of claim 15 wherein said second decoded value includes a data value and a length value and said apparatus further includes:
   a. decode value storage means for retaining said decode value; and
   b. a means for shifting said sample VLC by said length value for subsequent decoding of said variable length data.

17. A storage medium containing instructions configured to cause a computer to perform the following steps:
   a. determining whether a sample variable length code (VLC) has a predetermined relationship with a first pattern, said first pattern including a first portion having a predetermined pattern, a length of said first portion of said sample VLC corresponding to an optimum number of cache lines;
   b. if said sample VLC has said predetermined relationship with said first pattern, then using said sample VLC to retrieve a first decoded value from a first table; and
   c. else if said sample VLC does not have said predetermined relationship with said first pattern, then using said sample VLC to retrieve a second decoded value from a second table.

18. The storage medium of claim 17 wherein said first pattern includes a first valid VLC which is within a cache line boundary.

19. The storage medium of claim 18 wherein said cache line boundary is located at a boundary of said optimum number of cache lines.

20. The storage medium of claim 17 wherein said step of determining whether said sample VLC has said predetermined relationship with said first pattern includes determining if said sample VLC has a value greater than a threshold value represented by said first pattern.

21. The storage medium of claim 17 wherein said step of using said sample VLC to retrieve said first decoded value from said first table includes using a first portion of said sample VLC to access a first location in said first table, and retrieving said first decoded value therefrom.

22. The storage medium of claim 21 wherein said first decoded value includes a data value and a length value and said storage medium further includes instructions configured to cause a computer to perform the steps of:
   a. using said data value as a decode value; and
   b. shifting said VLC by said length value for subsequent decoding of said variable length data.

23. The storage medium of claim 17 wherein said step of using said sample VLC to retrieve said second decoded value from said second table includes using a second portion of said sample VLC to access a first location in said second table, and retrieving said second decoded value therefrom.

24. The storage medium of claim 23 wherein said second decoded value includes a data value and a length value and said storage medium further includes instructions configured to cause the computer to perform the steps of:
   a. using said data value as a decode value; and
   b. shifting said VLC by said length value for subsequent decoding of said variable length data.

* * * * *